US008618835B2

(12) United States Patent
Catli et al.

(10) Patent No.: US 8,618,835 B2
(45) Date of Patent: Dec. 31, 2013

(54) COMPACT HIGH-SPEED MIXED-SIGNAL INTERFACE

(75) Inventors: Burak Catli, Costa Mesa, CA (US); Ali Nazemi, Aliso Viejo, CA (US); Mahmoud Reza Ahmadi, Huntingdon Beach, CA (US); Ullas Singh, Irvine, CA (US); Jun Cao, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 21 days.

(21) Appl. No.: 13/242,643

(22) Filed: Sep. 23, 2011

(65) Prior Publication Data

US 2013/0076394 A1    Mar. 28, 2013

(51) Int. Cl.
*H03K 19/0175* (2006.01)
(52) U.S. Cl.
USPC ............................................................. 326/63
(58) Field of Classification Search
USPC .................... 326/58, 62–68, 80–81
See application file for complete search history.

(56) References Cited

U.S. PATENT DOCUMENTS

| 5,276,366 | A  | * | 1/1994  | Quigley et al. ............... 326/63 |
| 7,176,720 | B1 | * | 2/2007  | Prather et al. ................ 326/80 |
| 2006/0238399 | A1 | * | 10/2006 | Mizukami et al. ........... 341/155 |
| 2010/0214025 | A1 | * | 8/2010  | Chen et al. ................... 331/8 |
| 2011/0267129 | A1 | * | 11/2011 | King ........................... 327/307 |

* cited by examiner

*Primary Examiner* — Thienvu Tran
(74) *Attorney, Agent, or Firm* — Sterne, Kessler, Goldstein & Fox P.L.L.C.

(57) ABSTRACT

An apparatus is disclosed for converting signals from one digital integrated circuit family to be compatible with another digital integrated circuit family. The apparatus includes a primary interface and a secondary interface to convert a differential output signal from one digital integrated circuit family for use as an input signal by another digital integrated circuit family. The primary and secondary interfaces include gain stages that are configurable to provide rail to rail voltage swings and are characterized as having single pole architectures. The secondary interface may be unterminated such that a substantially equal load is presented to both components of the differential output signal.

24 Claims, 8 Drawing Sheets

COMPACT HIGH-SPEED MIXED-SIGNAL INTERFACE

BACKGROUND

1. Field of Invention

The invention relates to mixed signal environments, and more specifically to an interface between digital integrated circuit families for converting signals from one digital integrated circuit family to be compatible with another digital integrated circuit family.

2. Related Art

As the optical communication speed migrates to higher-data rates to meet increasing demand of network infrastructures, optical transceiver products have become a hot market attracting many companies with their various products. As a result, beyond meeting tough design requirements, two specifications have become key to differentiate one product from the other in order to gain market share: power and area consumption. Since the traditional circuit and system approaches have their own limits in terms of area and power, integrated circuit designers seek new techniques, such as replacing current mode logic (CML) with complementary metal oxide semiconductor (CMOS) logic in order to save power.

Conventionally, high-speed logic has been entirely implemented with CML circuits. However, ever decreasing feature size and decreasing power of basic electronic circuits of the CMOS logic family have made the CMOS logic family attractive to integrated circuit designers. As a result, the integrated circuit designers have been replacing high-speed logic that has been implemented using entirely CML circuits by mixing the CML family and the CMOS logic family. Mixing of the integrated circuit families in this manner typically requires an interface between the CML family and the CMOS logic family to convert signals from the CML family to be compatible with the CMOS logic family. For example, the CML family provides high-speed low-swing (a few hundred mVs) differential signals while the CMOS logic family rail-to-rail (0 to VDD) signals. In this example, an interface is required to convert the high-speed low-swing output signals of the CML family to rail-to-rail input signals for the CMOS logic family.

Conventional interfaces have utilized a two-stage amplifier, such as a differential pair and an active loaded common source amplifier, to make this conversion. The differential pair conventionally applies the low swing output signal of CML family while the active loaded common source amplifier provides rail to rail operation with further amplification. However, this conventional approach has inherently low bandwidth due to its two-pole architecture. For example, the two-pole architecture limits the speed of the conventional interface to approximately 6 or 7 GB/s when using a 40 nm CMOS fabrication technology. Additionally, performance of the conventional interface depends upon a common mode level of input. As a result, the conventional interface typically includes an additional bias circuit to provide the common mode level for its input. This additional bias circuit consumes more power and area.

Thus, there is a need for a high-speed interface between digital integrated circuit families to convert signals from one digital integrated circuit family to be compatible with another digital integrated circuit family that overcomes the shortcomings described above. Further aspects and advantages of the present invention will become apparent from the detailed description that follows.

BRIEF DESCRIPTION OF THE DRAWINGS/FIGURES

Embodiments of the invention are described with reference to the accompanying drawings. In the drawings, like reference numbers indicate identical or functionally similar elements. Additionally, the left most digit(s) of a reference number identifies the drawing in which the reference number first appears.

The invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following Detailed Description refers to accompanying drawings to illustrate exemplary embodiments consistent with the invention. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the invention. Therefore, the Detailed Description is not meant to limit the invention. Rather, the scope of the invention is defined only in accordance with the following claims and their equivalents.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the invention. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Exemplary Mixed Family Digital Signal Operational Environment

Digital integrated circuits are formed by interconnecting or mixing basic electronic circuits of one digital integrated circuit family that have similar operational characteristics, such as power consumption, speed, logic level swing, and area to provide some examples, with basic electronic circuits of another digital integrated circuit family that have different operational characteristics. Mixing of the integrated circuit families in this manner typically requires an interface between digital integrated circuit families to convert signals from one digital integrated circuit family to be compatible with another digital integrated circuit family.

Figure 1:
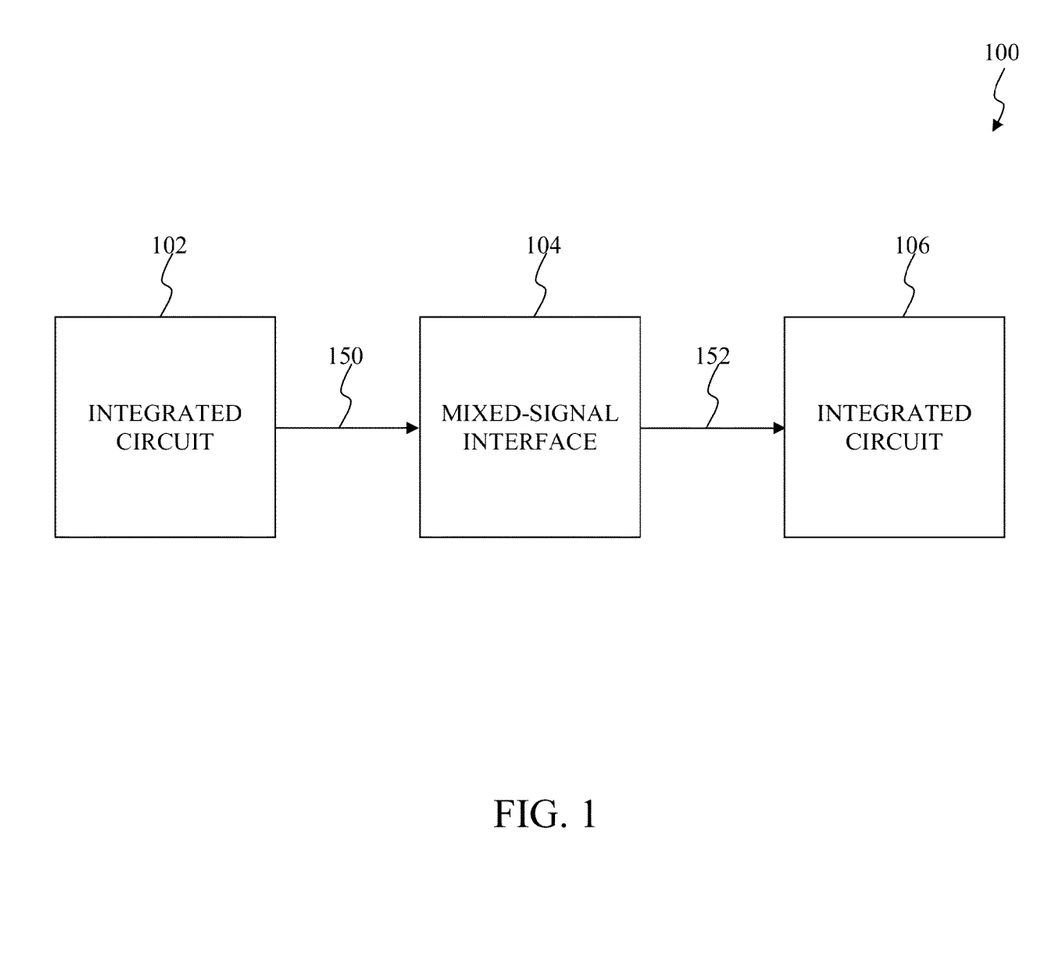
FIG. 1 illustrates a block diagram of a mixed family digital signal operational environment according to an exemplary embodiment of the invention.

FIG. 1 illustrates a block diagram of a mixed family digital signal, herein referred to as mixed-signal, operational environment according to an exemplary embodiment of the invention. A family digital signal environment 100 includes a first integrated circuit 102, a mixed-signal interface 104, and a second integrated circuit 106.

The first integrated circuit 102 is implemented using basic electronic circuits of a first digital integrated circuit family to provide an output signal 150. The output signal 150 is characterized by operational characteristics of the first digital integrated circuit family. The first digital integrated circuit family may include resistor-transistor logic (RTL), diode transistor logic (DTL), current mode logic (CML) also referred to as emitter-coupled logic (ECL), gunning transceiver logic (GTL), transistor-transistor logic (TTL), p-type metal oxide semiconductor logic (PMOS), n-type metal oxide semiconductor (NMOS) logic, complementary metal oxide semiconductor (CMOS) logic, bipolar complementary metal oxide semiconductor (BiCMOS) logic, integrated injection logic (I2L), or any other suitable digital integrated circuit family that will be apparent to those skilled in the relevant art(s) without departing from the spirit and scope of the present invention.

The mixed-signal interface 104 serves as an interface between the first integrated circuit 102 and the second integrated circuit 106. The mixed-signal interface 104 converts the output signal 150 from the first integrated circuit 102 to provide an input signal 152 for the second integrated circuit 106. The input signal 152 is compatible with operational characteristics of second digital integrated circuit family. In an exemplary embodiment, the output signal 150 and/or the input signal 152 represent differential signals. In this exemplary embodiment, the mixed-signal interface 104 may also convert the output signal 150 from the differential signal to a single-ended signal.

The second integrated circuit 106 includes basic electronic circuits of the second digital integrated circuit family to operate upon the input signal 152. The second digital integrated circuit family may include resistor-transistor logic (RTL), diode transistor logic (DTL), current mode logic (CML) also referred to as emitter-coupled logic (ECL), gunning transceiver logic (GTL), transistor-transistor logic (TTL), p-type metal oxide semiconductor logic (PMOS), n-type metal oxide semiconductor (NMOS) logic, complementary metal oxide semiconductor (CMOS) logic, bipolar complementary metal oxide semiconductor (BiCMOS) logic, integrated injection logic (I2L), or any other suitable digital integrated circuit family that will be apparent to those skilled in the relevant art(s) without departing from the spirit and scope of the present invention.

The first integrated circuit 102, the mixed-signal interface 104, and the second integrated circuit 106 may be implemented on a common chip or die. Alternatively, at least one of the first integrated circuit 102 and/or the mixed-signal interface 104 may be implemented on a first common chip or die and at least one of the mixed-signal interface 104 and/or the second integrated circuit 106 may be implemented on a second common chip or die, the second common chip or die being coupled to the first common chip or die. The second common chip or die is coupled to the first common chip or die using coaxial cables, wire bonding, metal layers of a semiconductor fabrication process, printed circuit board traces on a printed circuit board, or any other suitable means that will be apparent to those skilled in the relevant art(s) without departing from the spirit and scope of the present invention.

Although FIG. 1 illustrates the first integrated circuit 102 and the second integrated circuit 106 as including basic electronic circuits of digital integrated circuit families, those skilled in the relevant art(s) will recognize that the mixed-signal interface 104 may also be implemented to serve as an interface between analog integrated circuit families or between an analog circuit family and a digital integrated circuit family without departing from the spirit and scope of the present invention. For example, the first integrated circuit 102 and the second integrated circuit 106 may include basic electronic circuits of one or more analog integrated circuit families to provide the provide an output signal 150 and to operate upon the input signal 152, respectively.

Exemplary Mixed-Signal Interface

Figure 2:
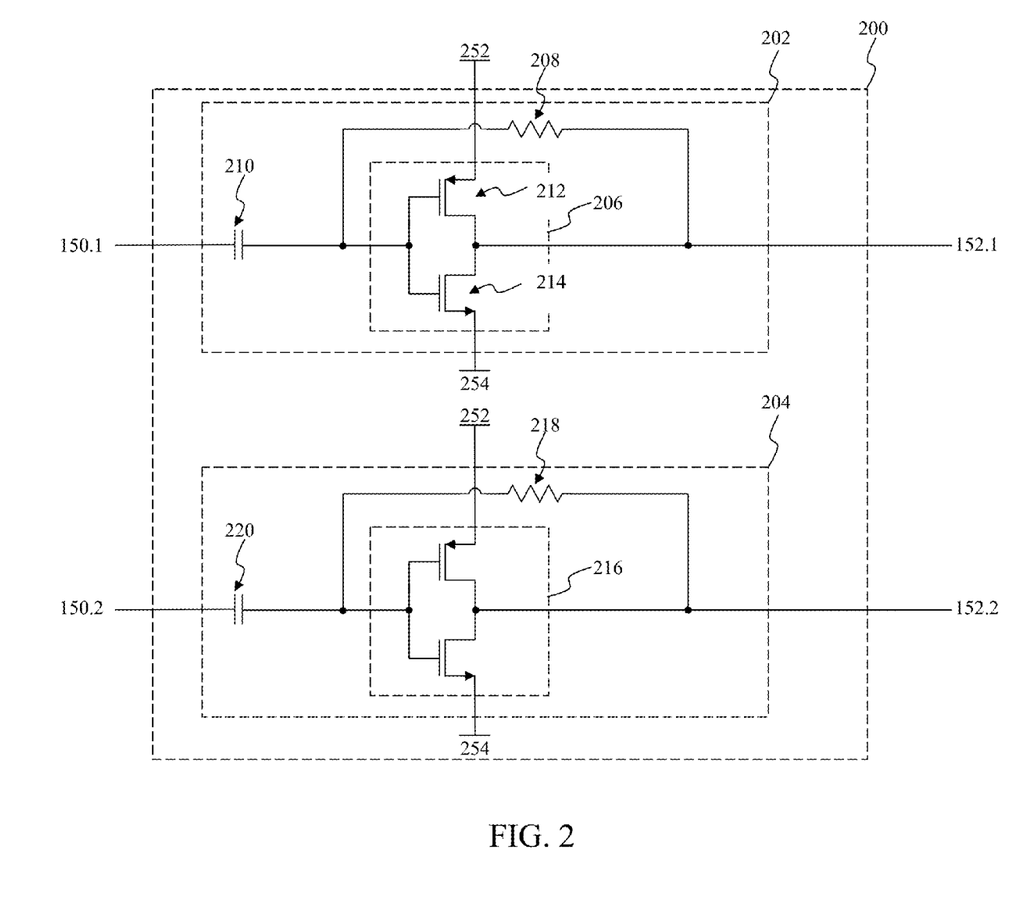
FIG. 2 illustrates a block diagram of a mixed-signal interface that may be implemented within the mixed family digital signal operational environment according to an exemplary embodiment of the invention.

FIG. 2 illustrates a block diagram of a mixed-signal interface that may be implemented within the mixed family digital signal operational environment according to an exemplary embodiment of the invention. A mixed-signal interface 200 converts the output signal 150 that is characterized by operational characteristics of the first digital integrated circuit family to provide the input signal 152 that is compatible with operational characteristics of the second digital integrated circuit family. The mixed-signal interface 200 includes a primary interface 202 and a secondary interface 204. The mixed-signal interface 200 may represent an exemplary embodiment of the mixed-signal interface 104.

As discussed above, the output signal 150 and the input signal 152 may represent differential signals having a first signal component 150.1 and a second signal component 150.2 and a first signal component 152.1 and a second signal component 152.2, respectively. The primary interface 202 converts the first signal component 150.1 that is characterized by operational characteristics of the first digital integrated circuit family to provide the first signal component 152.1 that is compatible with operational characteristics of the second digital integrated circuit family. The primary interface 202 includes a gain stage 206, a feedback resistor 208, and a decoupling capacitor 210.

Generally, the gain stage 206 is implemented using any suitable amplifier, such as an active loaded common source amplifier to provide an example, which is configurable to provide rail to rail voltage swing and is characterized as having a single pole architecture. The single pole architecture of the gain stage 206 allows the primary interface 202 to operate on high speed signals, such as 12 Gb/s or greater when using a 40 nm CMOS fabrication technology. In an exemplary embodiment, the gain stage 206 may include a p-type metal oxide semiconductor (PMOS) device 212 and an n-type metal oxide semiconductor (NMOS) device 214 that are configured and arranged to form a complementary metal oxide semiconductor (CMOS) inverter.

The gain stage 206 converts a logic level of the first signal component 150.1, which is typically on the order of millivolts, into another logic level, that may be characterized by a minimum that corresponds to a first potential and a maximum that corresponds to a second potential, commonly referred to as the rail to rail voltage swing. The PMOS device 212 provides a first potential 252, such as approximately 3.3V to provide an example, as an output of the gain stage 206 when a voltage from its gate to its source is less than its threshold voltage. The NMOS device 214 provides a second potential 254, such as approximately 0V to provide an example, as the output of the gain stage 206 when a voltage from its gate to its source is greater than its threshold voltage.

The primary interface 202 includes the feedback resistor 208 to self-bias the PMOS device 212 and the NMOS device 214. Specifically, the feedback resistor 208 is used to set a common mode component of an input of the gain stage 206 to a range at which the gain stage 206 has a largest gain. Typically, the gain stage 206 has the largest gain at its threshold voltage. The threshold voltage of the gain stage 206 represents a voltage which when applied to an input of the gain stage 206 produces an approximately equal output voltage. In an exemplary embodiment, the threshold of the gain stage 206 is approximately an average of the first potential 252 and the second potential 254.

Figure 8:
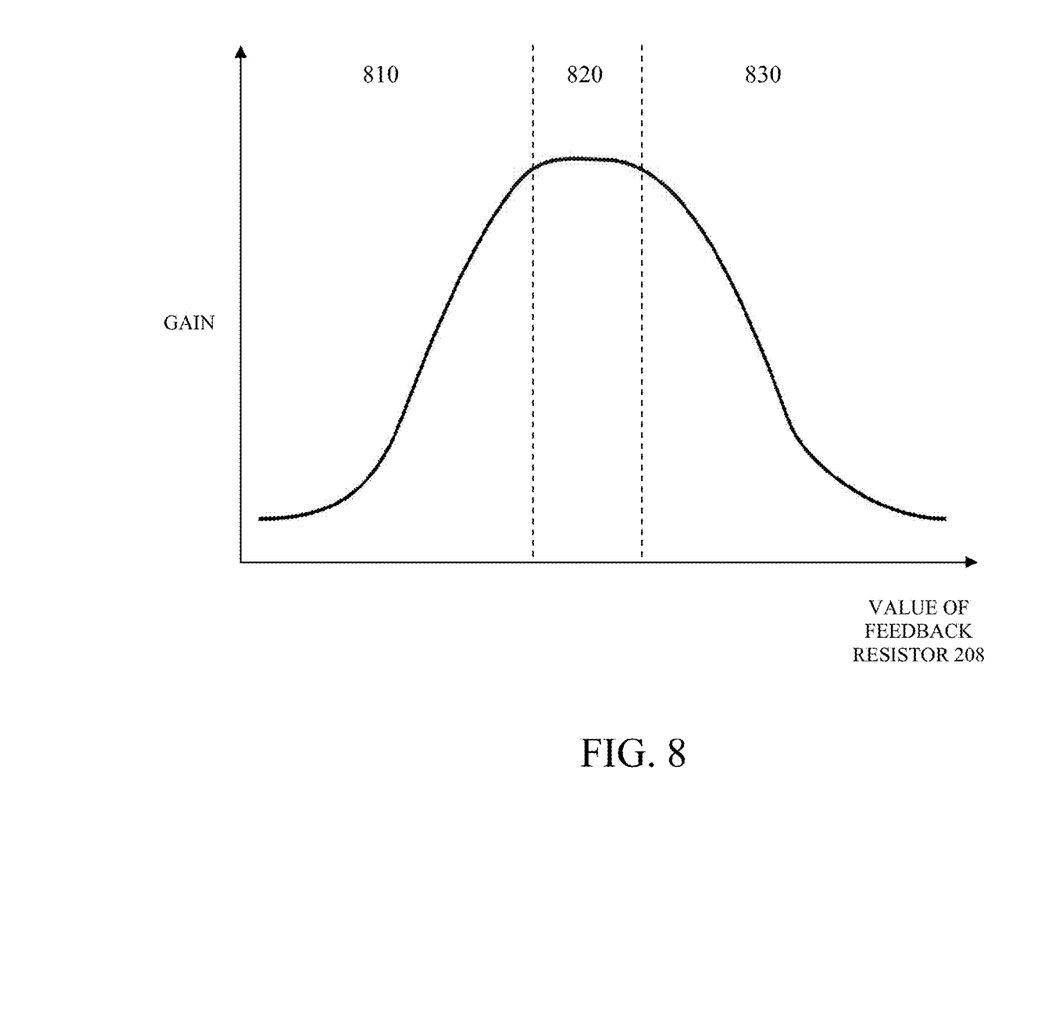
FIG. 8 graphically illustrates selection of a feedback resistor of a gain stage that may be implemented within the mixed family digital signal operational environment according to an exemplary embodiment of the invention.

FIG. 8 graphically illustrates selection of a feedback resistor of a gain stage that may be implemented within the mixed family digital signal operational environment according to an exemplary embodiment of the invention. Generally, the feedback resistor 208 is chosen to be as large as possible without limiting a gain of the gain stage 206. As shown in region 810, the gain of the gain stage 206 is limited by a low value for the feedback resistor 208. The gain of the gain stage 206 may be increased by increasing a value of the feedback resistor 208 from region 810 to region 820 that represents a range of optimum gain. However, if the value of the feedback resistor 208 is too large, the feedback resistor 208 in combination with the single pole of the gain stage 206 may detrimentally limit the gain of the primary interface 202 as shown in region 830. Typically, the feedback resistor 208 is on the order of 10 kΩ.

Referring back to FIG. 2, the decoupling capacitor 210 provides direct current (DC) isolation between the first integrated circuit 102 and the primary interface 202.

The secondary interface 204 converts the second signal component 150.2 that is characterized by operational characteristics of the first digital integrated circuit family to provide the second signal component 152.2 that is compatible with operational characteristics of the second digital integrated circuit family. The secondary interface 204 includes a gain stage 212, a feedback resistor 214, and a decoupling capacitor 216. The gain stage 212, the feedback resistor 214, and the decoupling capacitor 216 operate in a substantially similar manner as the gain stage 206, the feedback resistor 208, and the decoupling capacitor 210, respectively.

In an exemplary embodiment, the mixed-signal interface 200 may additionally convert the first signal component 150.1 and the second signal component 150.2 from the differential signal to a single-ended signal to provide the first signal component 152.1. In this exemplary embodiment, the second signal component 152.2 is not coupled to the second integrated circuit 104. In other words, the second signal component 152.2 is characterized as being unterminated, namely floating. Rather, the secondary interface 204 presents a substantially similar load as the primary interface 202 on the output signal 150. In other words, the secondary interface 204 ensures that the load that is presented to the second signal component 150.2 is substantially equal to that is presented to the first signal component 150.1. For example, the primary interface 202 presents a first load to the first signal component 150.1 and the secondary interface presents a second load to the second signal component 150.2, the second load being substantially similar to the first load. Typically, in this exemplary embodiment, the secondary interface 204 is substantially similar to the primary interface 202 to cause the first load to be substantially similar to the second load.

Alternate Exemplary Interface

Figure 3:
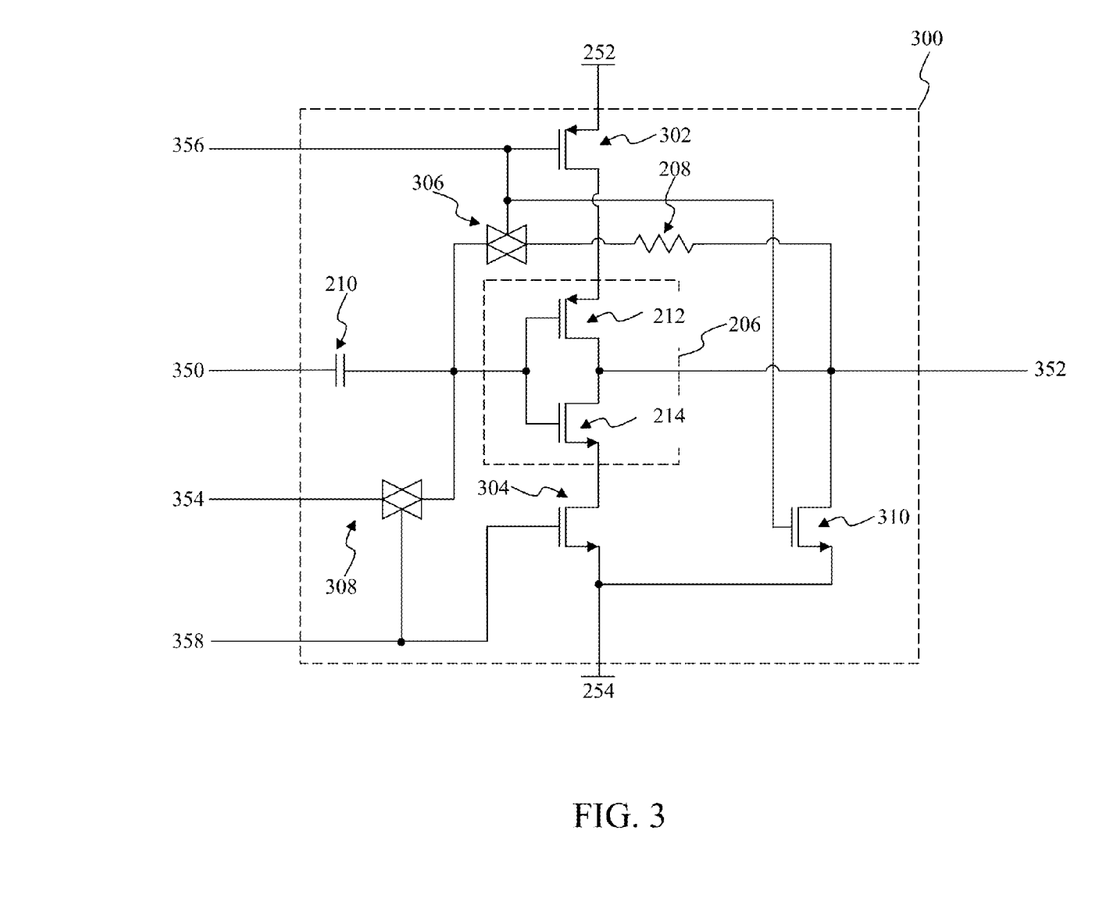
FIG. 3 illustrates a block diagram of an alternate interface that may be used in the mixed-signal interface according to an exemplary embodiment of the invention.

FIG. 3 illustrates a block diagram of an alternate interface that may be used in the mixed-signal interface according to an exemplary embodiment of the invention. An interface 300 converts an output signal 350 that is characterized by operational characteristics of the first digital integrated circuit family to provide an input signal 352 that is compatible with operational characteristics of the second digital integrated circuit family. The interface 300 represents an alternative interface that may be implemented within the mixed-signal interface 200 in lieu of the primary interface 202 and/or the secondary interface 204. The interface 300 operates in a substantially similar manner as the primary interface 202 and/or the secondary interface 204; however, the interface 300 includes additional circuitry that may be used to power-down and/or power-up the interface 300 without any substantial compromise in speed. The interface 300 includes the gain stage 206, the feedback resistor 208, the decoupling capacitor 210, a first potential switch 302, a second potential switch 304, a feedback transmission gate 306, an input transmission gate 308, and an output switch 310.

The gain stage 206 may be deactivated or powered-down by deactivating the first potential switch 302 and/or the second potential switch 304. The first potential switch 302 is coupled between the first potential 252 and the gain stage 206. The first potential switch 302 couples the first potential 252 to the gain stage 206 when activated or closed in accordance with a first control signal 356. Alternatively, the first potential switch 302 decouples the first potential 252 from the gain stage 206 when deactivated or opened in accordance with the first control signal 356. This decoupling prevents the first potential 252 from being applied to the gain stage 206.

The second potential switch 304 is coupled between the second potential 254 and the gain stage 206. The second potential switch 304 couples the second potential 254 to the gain stage 206 when activated or closed in accordance with a second control signal 358. Alternatively, the second potential switch 304 decouples the second potential 254 from the gain stage 206 when deactivated or opened in accordance with the second control signal 358. This decoupling prevents the second potential 254 from being applied to the gain stage 206.

The feedback transmission gate 306 is coupled between the gain stage 206 and the feedback resistor 208. The feedback transmission gate 306 couples an input of the gain stage 206 to the feedback resistor 208 to form a feedback path when activated or closed in accordance with the first control signal 356. Alternatively, the feedback transmission gate 306 decouples the gain stage 206 from the feedback resistor 208 when deactivated or opened in accordance with the first control signal 356. This decoupling prevents unwanted leakage of the output signal 350 from passing onto the input signal 352 via the feedback resistor 208 when the gain stage 206 is deactivated or turned off.

The input transmission gate 308 prevents an input of the gain stage 206 from floating when the feedback transmission gate 306 is inactive or turned off. When the feedback transmission gate 306 is active or turned on, the feedback resistor 208 is coupled to the gain stage 206. Typically, the input of the gain stage 206 is determined based upon the selection of the feedback resistor 208 as discussed above. However, when the feedback transmission gate 306 is inactive of turned off, the input of the gain stage may float or swing on any arbitrary common mode level ranging from the first potential 252 to the second potential 254 when the feedback resistor 208 is decoupled from the gain stage 206. To prevent the input of the gain stage 206 from floating, the input transmission gate 308 is activated or turned on in accordance with the second control signal 358 to apply a reference voltage 354 to the input of the gain stage 206. Typically, the reference voltage 354 is approximately an average of the first potential 252 and the second potential 254. However, those skilled in the relevant art(s) will recognize that other voltages may be used as the reference voltage 354 without departing from the spirit and scope of the present invention.

The output switch 310 is coupled between the gain stage 206 and the second potential. The feedback output switch 310 couples an output of the gain stage 206 to the second potential 254 when activated or closed in accordance with the first control signal 356. This coupling prevents unwanted leakage of the output signal 350 from passing onto the input signal 352 via the gain stage 206 when the gain stage 206 is deactivated or turned off. Alternatively, the output switch 310 decouples the output of the gain stage 206 from the second potential 254 when deactivated or opened in accordance with the first control signal 356.

Typically, the size of the feedback transmission gate 306 and a size of the output switch 310 are smaller than a size of the PMOS device 212 and/or a size the NMOS device 214. For example, the feedback transmission gate 306 and the output switch 310 may be implemented to have their respective lengths and/or widths to be approximately one half the respective lengths and/or widths of the PMOS device 212 and/or the NMOS device 214.

Although the second potential switch 304 and the output switch 310 are illustrated as NMOS devices those skilled in the relevant art(s) will recognize that the second potential switch 304 and/or the output switch 310 may be implemented as PMOS devices without departing from the spirit and scope of the present invention. Likewise, those skilled in the relevant art(s) will recognize that the first potential switch 302 may be implemented as an NMOS device without departing from the spirit and scope of the present invention.

Exemplary Applications for the Mixed-Signal Interface

The exemplary applications for the mixed-signal interface that are to be discussed below are for illustrative purposes only. Those skilled in the relevant art(s) will recognize that the mixed-signal interface may be used in other applications without departing from the spirit and scope of the present invention.

Figure 4:
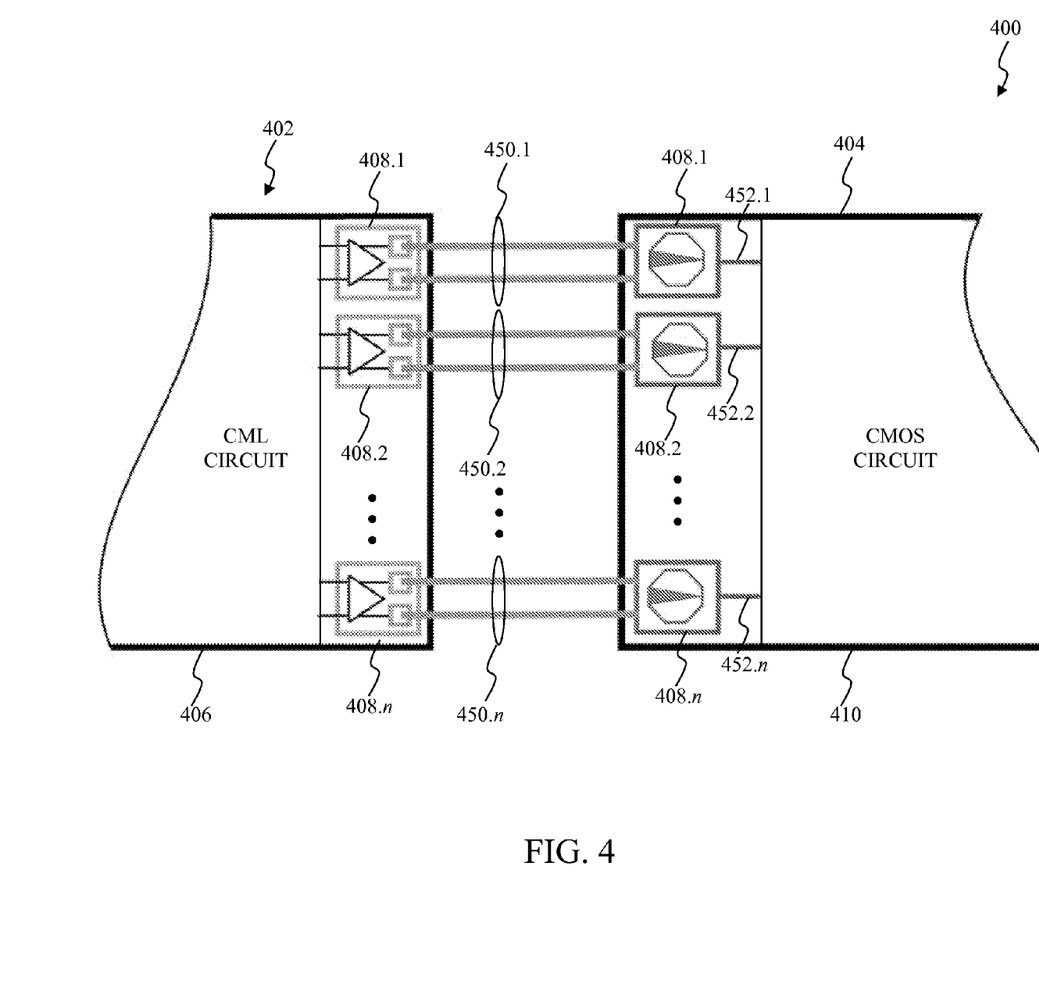
FIG. 4 illustrates a block diagram of a first exemplary application of the mixed-signal interface according to an exemplary embodiment of the invention.

FIG. 4 illustrates a block diagram of a first exemplary application of the mixed-signal interface according to an exemplary embodiment of the invention. In a first exemplary application 400, mixed-signal interfaces convert output signals that are characterized by operational characteristics of a current mode logic (CML) family to provide input signals that are compatible with operational characteristics of a complementary metal oxide semiconductor (CMOS) logic family.

As shown in FIG. 4, the first semiconductor chip 402 is implemented using basic electronic circuits of the CML family to provide output signals 450.1 through 450.n. The output signals 450.1 through 450.n are characterized by operational characteristics of the CML family. The first semiconductor chip 402 includes a CML circuit 406 and differential output buffers 408.1 through 408.n. The CML circuit 406 includes basic electronic circuits of the CML family to implement one or more functions. The differential output buffers 408.1 through 408.n provide one or more differential signals from the CML circuit 406 as the output signals 450.1 through 450.n.

The second semiconductor chip 404 includes mixed-signal interfaces 408.1 through 408.n and a CMOS logic circuit 410. The mixed-signal interfaces 408.1 through 408.n convert the output signals 450.1 through 450.n from operational characteristics of the CML family to provide input signals 452.1 through 452.n that are characterized by operational characteristics of the CMOS logic family. Each of the mixed-signal interfaces 408.1 through 408.n may represent an exemplary embodiment of the mixed-signal interface 104 and/or the mixed-signal interface 200. The digital logic circuit 410 includes basic electronic circuits of the CMOS logic family to operate upon the input signals 452.1 through 452.n to implement one or more functions.

Figure 5:
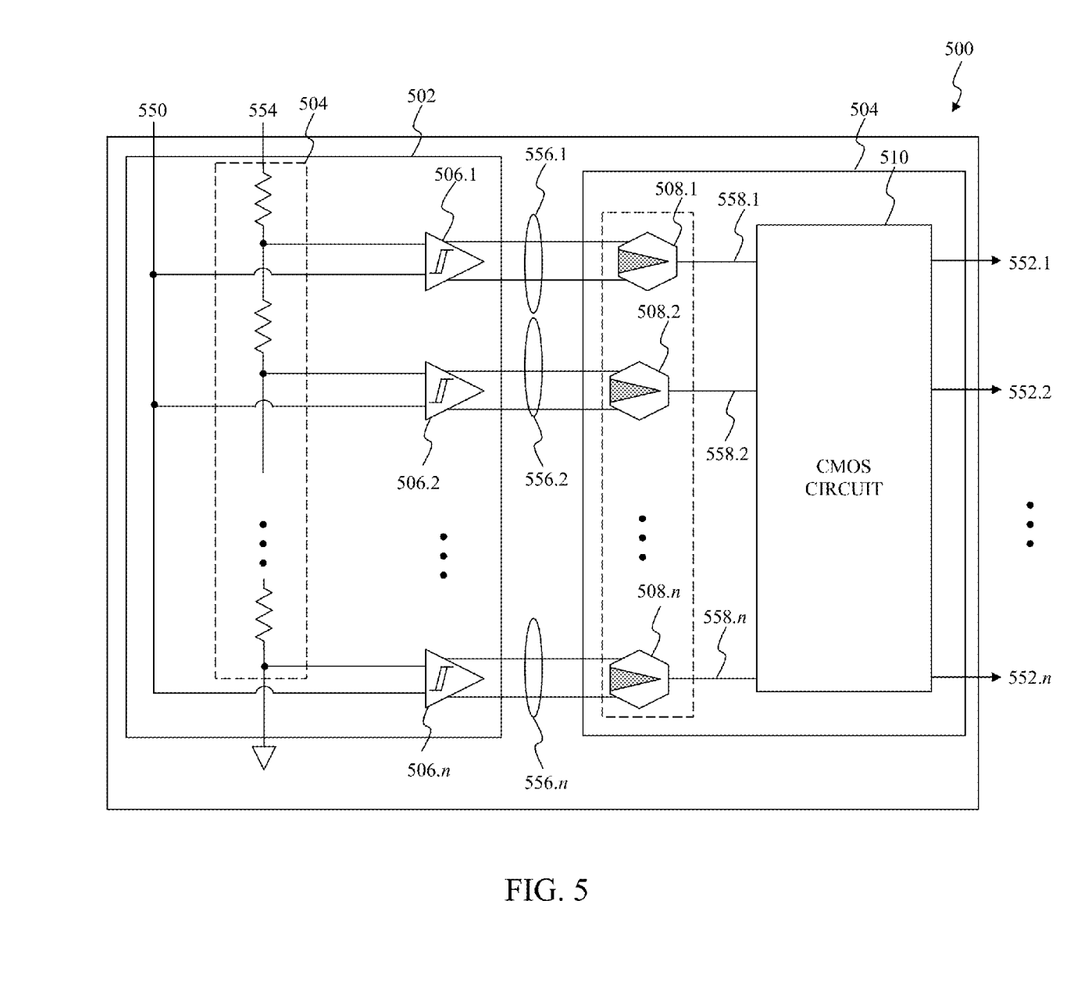
FIG. 5 illustrates a block diagram of a second exemplary application of the mixed-signal interface according to an exemplary embodiment of the invention.

FIG. 5 illustrates a block diagram of a second exemplary application of the mixed-signal interface according to an exemplary embodiment of the invention. In the second exemplary application, mixed-signal interfaces are implemented as part of an analog to digital converter (ADC) 500. The ADC 500 converts an analog input signal 550 into digital output signals 552.1 through 552.n. The ADC 500 includes a first portion 502 and a second portion 504.

The first portion 502 is implemented using basic electronic circuits of a current mode logic (CML) family to provide output signals 556.1 through 556.n. The output signals 556.1 through 556.n are characterized by operational characteristics of the CML family. The first portion 502 includes a resistor ladder 504 and differential comparators 506.1 through 506.n. The resistor ladder 504 divides a reference voltage 504 along a series of resistors, commonly referred to as resistive taps. The differential comparators 506.1 through 506.n compare the analog input signal 550 with a voltage at a corresponding one of the resistive taps to provide the output signals 556.1 through 556.n. The output signals 556.1 through 556.n represent a digital representation of the analog input signal 550.

The second portion 504 includes mixed-signal interfaces 508.1 through 508.n and a complementary metal oxide semiconductor (CMOS) logic circuit 510. The mixed-signal interfaces 508.1 through 508.n convert the output signals 556.1 through 556.n from operational characteristics of the CML family to provide input signals 558.1 through 558.n that are characterized by operational characteristics of the CMOS logic family. Each of the mixed-signal interfaces 508.1 through 508.n may represent an exemplary embodiment of the mixed-signal interface 104 and/or the mixed-signal interface 200. The digital logic circuit 510 includes basic electronic circuits of the CMOS logic family to operate upon the input signals 558.1 through 558.n to implement one or more functions to provide the digital output signals 552.1 through 552.n.

Figure 6:
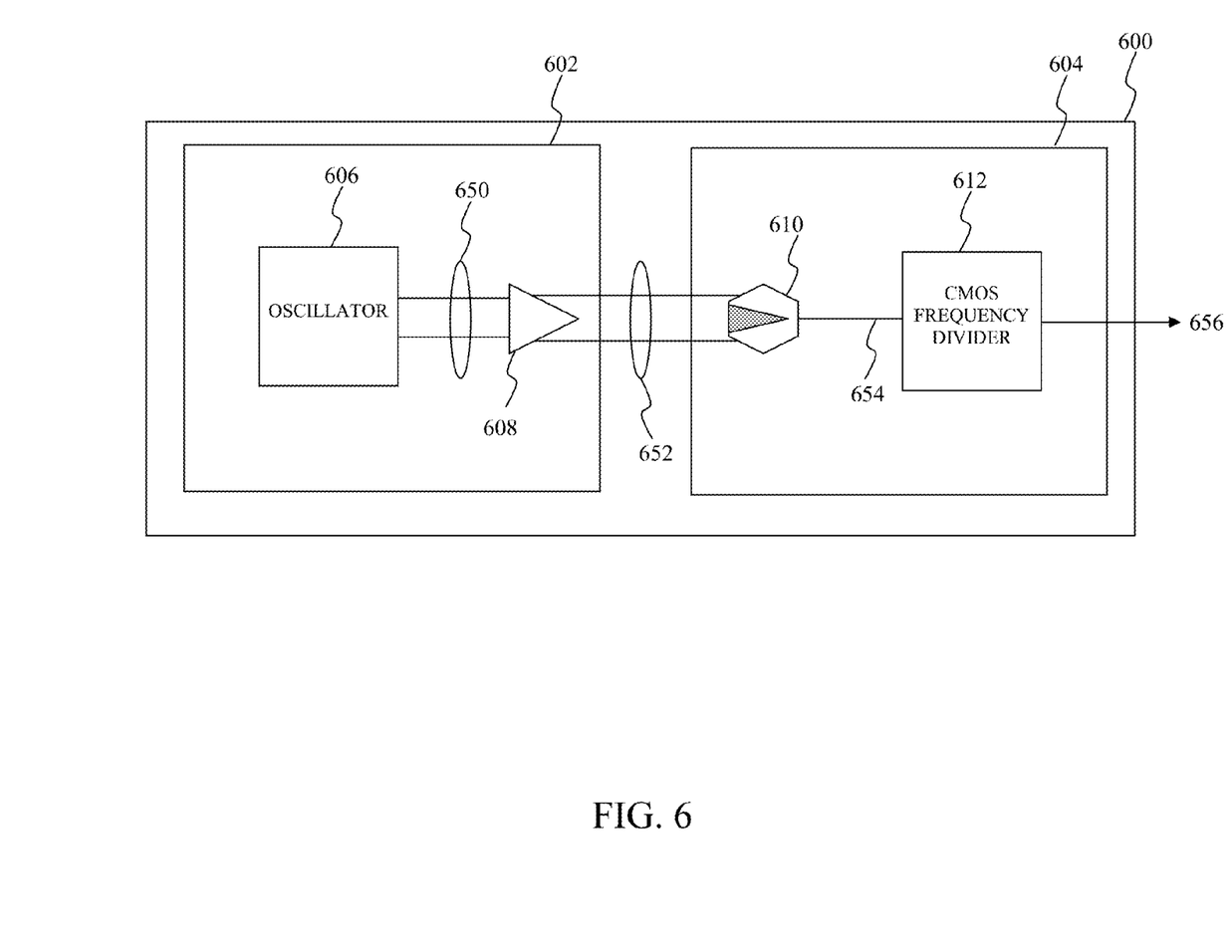
FIG. 6 illustrates a block diagram of a third exemplary application of the mixed-signal interface according to an exemplary embodiment of the invention.

FIG. 6 illustrates a block diagram of a third exemplary application of the mixed-signal interface according to an exemplary embodiment of the invention. In the third exemplary application, a mixed-signal interface is implemented as part of a frequency divider 600. In an exemplary embodiment, the frequency divider 600 may be implemented as part of a phase locked loop (PLL). The frequency divider 600 includes a first portion 602 and a second portion 604.

The first portion 602 is implemented using basic electronic circuits of a current mode logic (CML) family to provide an output signal 652. The output signal 652 is characterized by operational characteristics of the CML family. The first portion 602 includes an oscillator 606 and a differential amplifier 608. The oscillator 606 generates an output waveform 650. The oscillator 606 may represent a ring oscillator, a crystal oscillator, such as temperature-compensated crystal oscillator (TCXO), a voltage-controlled crystal oscillator (VCXO), or an oven-controlled crystal oscillator OCXO to provide some examples, a voltage controlled oscillator (VCO), or any other well-known oscillator that will be apparent to those skilled in the relevant art(s) without departing from the spirit and scope of the present invention. The differential amplifier 608 provides output waveform 650 from the oscillator 606 as the output signal 652. The differential amplifier 608 may, optionally, amplify the output waveform 650 by any suitable gain that is greater than, less than, or equal to approximately one.

The second portion 604 includes a mixed-signal interface 610 and a complementary metal oxide semiconductor (CMOS) frequency divider circuit 612. The mixed-signal interface 610 converts the output signal 652 from operational characteristics of the CML family to provide an input signal 654 that is characterized by operational characteristics of the CMOS logic family. The mixed-signal interface 610 may represent an exemplary embodiment of the mixed-signal interface 104 and/or the mixed-signal interface 200. The frequency divider circuit 612 includes basic electronic circuits of the CMOS logic family to divide the input signal 654 to provide an output signal 656.

Figure 7:
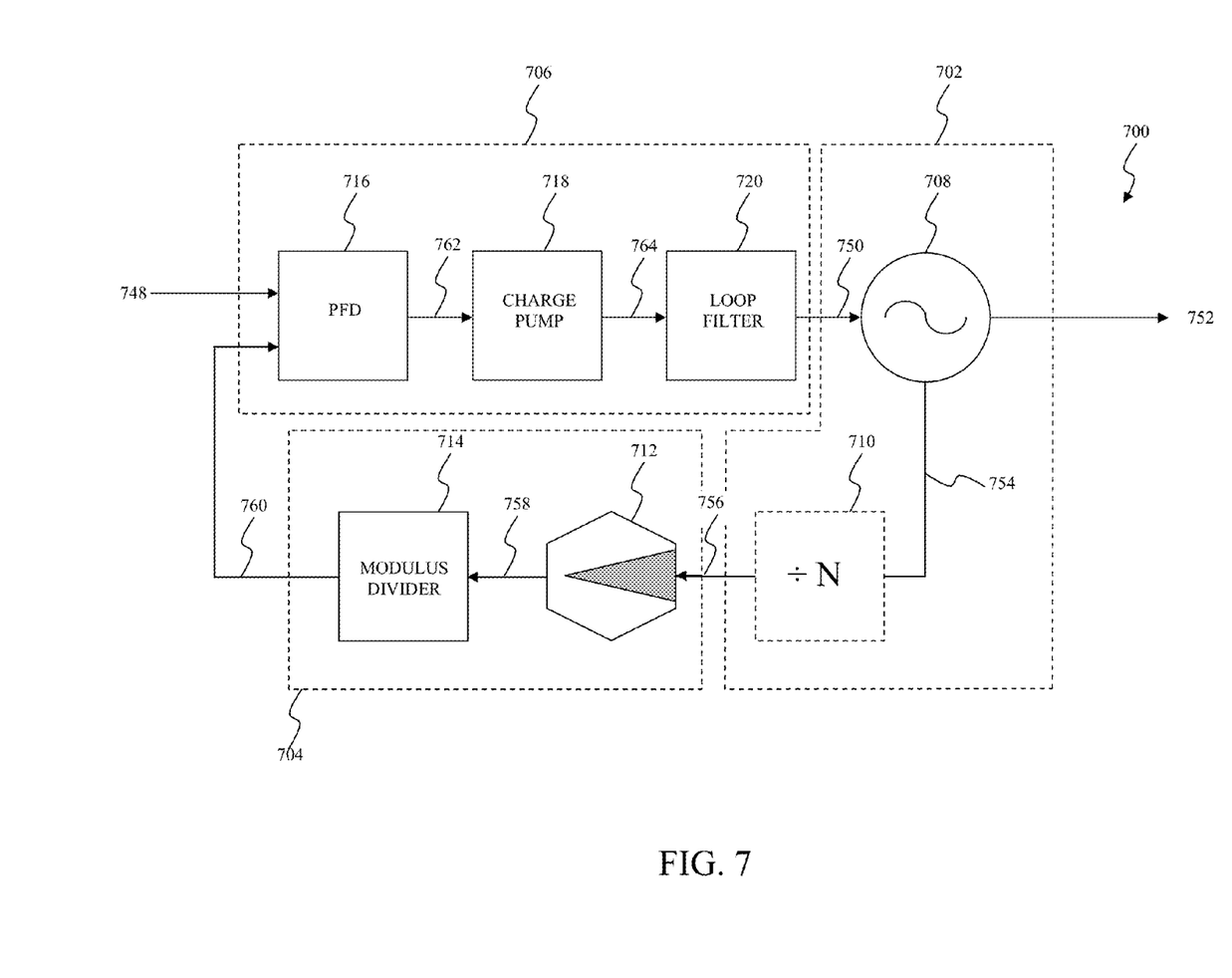
FIG. 7 illustrates a block diagram of a fourth exemplary application of the mixed-signal interface according to an exemplary embodiment of the invention.

FIG. 7 illustrates a block diagram of a fourth exemplary application of the mixed-signal interface according to an exemplary embodiment of the invention. In the fourth exemplary application, a mixed-signal interface is implemented as part of a fractional-n phase-locked loop (PLL) 700. The fractional-n PLL 700 includes a first portion 702, a second portion 704, and a third portion 706.

The first portion 702 is implemented using basic electronic circuits of a current mode logic (CML) family. The first portion 702 includes a voltage controlled oscillator (VCO) 708 and an optional pre-scalar module 710. The VCO 708 provides output waveforms 752 and 754 in response to an analog output 750 that is indicative of a difference between the output waveform 752 and a reference waveform 748. The VCO 708 may represent a ring oscillator, a crystal oscillator, such as temperature-compensated crystal oscillator (TCXO), a voltage-controlled crystal oscillator (VCXO), or an oven-controlled crystal oscillator OCXO to provide some examples, a voltage controlled oscillator (VCO), or any other well-known oscillator that will be apparent to those skilled in the relevant art(s) without departing from the spirit and scope of the present invention. The optional pre-scalar module 710 divides the output waveform 754 by an integer N to provide an output signal 756.

The second portion 704 includes a mixed-signal interface 712 and a complementary metal oxide semiconductor (CMOS) dual modulus divider 714. The mixed-signal interface 712 converts the output signal 756 from operational characteristics of the CML family to provide an input signal 758 that is characterized by operational characteristics of the CMOS logic family. The mixed-signal interface 712 may represent an exemplary embodiment of the mixed-signal interface 104 and/or the mixed-signal interface 200. The dual modulus divider 714 includes basic electronic circuits of the CMOS logic family to divide the input signal 758 to provide an output signal 760.

The third portion 706 is typically implemented using basic analog electronic circuits; however, the third portion 706 may be implemented using basic electronic circuits of the CML or of the CMOS family. The third portion 706 includes a phase/frequency detector (PFD) 716, a charge pump 718, and a loop filter 720. The PFD 102 is a device that converts the difference between the phase of the reference waveform 748 and a phase of the output signal 760 to generate an error signal 762. The charge pump 718 converts the error signal 154 to a voltage domain representation, denoted as charge pump output 764, to control the frequency of the VCO 108. The loop filter 720 may be used to remove undesirable noise from the charge pump output 156 to generate the analog output 750.

CONCLUSION

It is to be appreciated that the Detailed Description section, and not the Abstract section, is intended to be used to interpret the claims. The Abstract section may set forth one or more, but not all exemplary embodiments, of the invention, and thus, are not intended to limit the invention and the appended claims in any way.

The invention has been described above with the aid of functional building blocks illustrating the implementation of specified functions and relationships thereof The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents.

What is claimed is:

1. An apparatus for converting signals from a first digital integrated circuit family to be compatible with a second digital integrated circuit family, the second digital integrated circuit family being different from the first digital integrated circuit family, the apparatus comprising:

a primary interface configured to convert an output signal that is characterized by the first digital integrated circuit family to provide an input signal that is compatible with the second digital integrated circuit family, the primary interface including:

a gain stage configured to convert a first logic level of the output signal into a second logic level;

an input transmission gate, coupled between an input of the gain stage and a reference voltage, configured to couple the reference voltage to the input of the gain stage when a feedback path to the gain stage is deactivated; and an output switch, coupled between an output of the gain stage and a potential, configured to couple the output of the gain stage to the potential to prevent the output signal from leaking onto the input signal when the gain stage is deactivated.

2. The apparatus of claim 1, further comprising:
a first potential switch configured to apply the potential to the gain stage when activated by a first control signal; and
a second potential switch configured to apply a second potential to the gain stage when activated by a second control signal.

3. The apparatus of claim 1, further comprising:
a feedback transmission gate configured to provide the feedback path for the gain stage when activated by a control signal and to prevent leakage from the output signal onto the input signal when deactivated by the control signal.

4. The apparatus of claim 1, Wherein the output signal is a differential output signal having a first component and a second component, the primary interface being configured to convert the first component, and further comprising:
a secondary interface configured to convert the second component of the differential output signal that is characterized by the first digital integrated circuit family to be compatible with the second digital integrated circuit family.

5. The apparatus of claim 4, wherein the secondary interface is characterized as being unterminated such that a load that is presented to the second component is substantially similar to a load that is presented to the first component.

6. The apparatus of claim 4, wherein the primary interface is characterized as presenting a first load to the first component, and wherein the secondary interface is characterized as presenting a second load to the second component, the second load being substantially similar to the first load.

7. The apparatus of claim 1, wherein the first logic level is characterized by the first digital integrated circuit family, and wherein the second logic level is characterized by the second digital integrated circuit family.

8. The apparatus of claim 1, wherein the gain stage is characterized as having a single pole architecture.

9. The apparatus of claim 1, wherein the gain stage is characterized as providing a rail to rail voltage swing.

10. The apparatus of claim 1, wherein the gain stage comprises:
a p-type metal oxide semiconductor (PMOS) device and an n-type metal oxide semiconductor (NMOS) device that are configured and arranged to form a complementary metal oxide semiconductor (CMOS) inverter.

11. The apparatus of claim 1, wherein the first digital integrated circuit family is a current mode logic (CML) family and wherein the second digital integrated circuit family is a complementary metal oxide semiconductor (CMOS) logic family.

12. The apparatus of claim 1, wherein the input of the gain stage is configured to receive the output signal.

13. A mixed family digital signal operational environment apparatus, comprising:
a first integrated circuit that is implemented using electronic circuits of a first digital integrated circuit family to provide an output signal; and
a second integrated circuit coupled to the first integrated circuit, the second integrated circuit including:
a primary interface configured to convert the output signal that is characterized by the first digital integrated circuit family to provide an input signal that is compatible with a second digital integrated circuit family, the primary interface including:
a gain stage configured to convert a first logic level of the output signal into a second logic level;
an input transmission gate, coupled between an input of the gain stage and a reference voltage, configured to couple the reference voltage to the input of the gain stage when a feedback path to the gain stage is deactivated; and
an output switch, coupled between an output of the gain stage and a potential, configured to couple the output of the gain stage to the potential to prevent the output signal from leaking onto the input signal when the gain stage is deactivated.

14. The apparatus of claim 13, further comprising:
a first potential switch configured to apply the potential to the gain stage when activated by a first control signal; and
a second potential switch configured to apply a second potential to the gain when activated by a second control signal.

15. The apparatus of claim 14, wherein the first digital integrated circuit family is a current mode logic (CML) family and wherein the second digital integrated circuit family is a complementary metal oxide semiconductor (CMOS) logic family.

16. The apparatus of claim 13, further comprising:
a feedback transmission gate configured to provide the feedback path for the gain stage when activated by a control signal and to prevent leakage from the output signal onto the input signal when deactivated by the control signal.

17. The apparatus of claim 13, wherein the output signal is a differential output signal having a first component and a second component, the primary interface being configured to convert the first component, and further comprising:
a secondary interface configured to convert the second component of the differential output signal that is characterized by the first digital integrated circuit family to be compatible with the second digital integrated circuit family.

18. The apparatus of claim 17, wherein the secondary interface is characterized as being unterminated such that a load at is presented to the second component is substantially similar to a load that is presented to the first component.

19. The apparatus of claim 17, wherein the primary interface is characterized as presenting a first load to the first component, and wherein the secondary interface is characterized as presenting a second load to the second component, the second load being substantially similar to the first load.

20. The apparatus of claim 13, wherein the second integrated circuit further includes:

a logic circuit, coupled to the primary interface, that is implemented using electronic circuits of the second digital integrated circuit family and configured to operate upon the input signal.

21. The apparatus of claim 13, wherein the first integrated circuit and the second integrated circuit are configured and arranged to form an analog to digital converter (ADC).

22. The apparatus of claim 13, wherein the first integrated circuit and the second integrated circuit are configured and arranged to form part of a frequency divider.

23. The apparatus of claim 13, wherein the first logic level is characterized by the first digital integrated circuit family, and wherein the second logic level is characterized by the second digital integrated circuit family.

24. The apparatus of claim 13, wherein the input of the gain stage is configured to receive the output signal.

\* \* \* \* \*

UNITED STATES PATENT AND TRADEMARK OFFICE
CERTIFICATE OF CORRECTION

Page 1 of 1

PATENT NO. : 8,618,835 B2
APPLICATION NO. : 13/242643
DATED : December 31, 2013
INVENTOR(S) : Catli et al.

It is certified that error appears in the above-identified patent and that said Letters Patent is hereby corrected as shown below:

In the Claims

Column 12, Line 35
Please replace "gain when" with --gain stage when--.

Signed and Sealed this
Twenty-ninth Day of April, 2014

Michelle K. Lee
*Deputy Director of the United States Patent and Trademark Office*